US010770793B2

(12) United States Patent
Ryoo et al.

(10) Patent No.: US 10,770,793 B2
(45) Date of Patent: Sep. 8, 2020

(54) ANTENNA MODULE AND DUAL-BAND ANTENNA APPARATUS

(71) Applicant: Samsung Electro-Mechanics Co., Ltd., Suwon-si (KR)

(72) Inventors: Jeong Ki Ryoo, Suwon-si (KR); Sang Hyun Kim, Suwon-si (KR); Seung Goo Jang, Suwon-si (KR); Thomas A. Kim, Suwon-si (KR); Hong In Kim, Suwon-si (KR); Nam Ki Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 211 days.

(21) Appl. No.: 15/993,821

(22) Filed: May 31, 2018

(65) Prior Publication Data

US 2019/0198995 A1 Jun. 27, 2019

(30) Foreign Application Priority Data

Dec. 26, 2017 (KR) .................. 10-2017-0179224

(51) Int. Cl.
*H01Q 9/42* (2006.01)
*H01Q 1/24* (2006.01)
(Continued)

(52) U.S. Cl.
CPC ............ *H01Q 5/35* (2015.01); *H01Q 1/2283* (2013.01); *H01Q 1/243* (2013.01); *H01Q 1/38* (2013.01);
(Continued)

(58) Field of Classification Search
CPC ............ H01Q 5/35; H01Q 9/42; H01Q 1/243; H01Q 1/38; H01Q 1/24; H01Q 1/2283; H01Q 21/062; H01Q 21/065; H01Q 21/20
See application file for complete search history.

(56) References Cited

U.S. PATENT DOCUMENTS 9,806,422 B2 * 10/2017 Garcia ................ G06K 19/077
10,468,763 B2 11/2019 Yokoyama et al.
(Continued)

FOREIGN PATENT DOCUMENTS

CN 105337023 A 2/2016
CN 107078406 A 8/2017
(Continued)

OTHER PUBLICATIONS

Japanese Office Action dated Mar. 19, 2019 in counterpart Japanese Patent Application No. 2018-106651 (4 pages in English and 2 pages in Japanese).
(Continued)

*Primary Examiner* — Hoang V Nguyen
(74) *Attorney, Agent, or Firm* — NSIP Law

(57) ABSTRACT

An antenna module includes a connection member including at least one wiring layer and at least one insulating layer; an IC disposed on a first surface of the connection member and electrically connected to at least one wiring layer of the connection member; and an antenna package disposed on a second surface of the connection member and including first antenna members and feed vias, wherein the connection member includes a feed line having a first end electrically connected to a corresponding wire of at least one wiring layer of the connection member; a second antenna member electrically connected to a second end of the feed line and configured to transmit or receive a radio frequency (RF) signal; and a ground member spaced apart from the feed line in a direction toward the first surface or the second surface of the connection member.

18 Claims, 12 Drawing Sheets

(51) Int. Cl.
  *H01Q 5/35* (2015.01)
  *H01Q 1/38* (2006.01)
  *H01Q 1/22* (2006.01)
  *H01Q 21/06* (2006.01)
  *H01Q 21/20* (2006.01)

(52) U.S. Cl.
  CPC .............. *H01Q 9/42* (2013.01); *H01Q 21/062* (2013.01); *H01Q 21/065* (2013.01); *H01Q 21/20* (2013.01); *H01L 2223/6677* (2013.01); *H01L 2224/16227* (2013.01); *H01L 2924/15321* (2013.01); *H01L 2924/19105* (2013.01)

(56) References Cited

U.S. PATENT DOCUMENTS

| | | |
|---|---|---|
| 2003/0214442 A1 | 11/2003 | Back et al. |
| 2016/0043470 A1 | 2/2016 | Ko et al. |
| 2017/0047369 A1 | 2/2017 | Takahashi et al. |
| 2017/0125895 A1 | 5/2017 | Baks et al. |
| 2017/0222316 A1 | 8/2017 | Mizunuma et al. |
| 2017/0229769 A1 | 8/2017 | Yokoyama et al. |
| 2017/0317418 A1 | 11/2017 | Garcia et al. |

FOREIGN PATENT DOCUMENTS

| | | |
|---|---|---|
| JP | 2001-244731 A | 9/2001 |
| JP | 2016-149687 A | 8/2016 |
| JP | 6439481 B2 | 12/2018 |
| KR | 2003-0088987 A | 11/2003 |
| KR | 10-2014-0095808 A | 8/2014 |
| WO | WO 2015/105605 A1 | 7/2015 |
| WO | WO 2016/063759 A1 | 4/2016 |
| WO | WO 2016/067969 A1 | 5/2016 |
| WO | WO 2016/004158 A1 | 7/2016 |

OTHER PUBLICATIONS

Chinese Office Action dated Apr. 26, 2020 in counterpart Chinese Patent Application No. 201811092450.2 (29 pages in English and 19 in Chinese).

\* cited by examiner

ANTENNA MODULE AND DUAL-BAND ANTENNA APPARATUS

CROSS-REFERENCE TO RELATED APPLICATIONS

This application claims the benefit under 35 USC 119(a) of Korean Patent Application No. 10-2017-0179224 filed on Dec. 26, 2017, in the Korean Intellectual Property Office, the entire disclosure of which is incorporated herein by reference for all purposes.

BACKGROUND

1. Field

This application relates to an antenna module and a dual-band antenna apparatus.

2. Description of Related Art

Recently, millimeter wave (mmWave) communications systems including 5th generation (5G) communications systems have been actively researched, and research into the commercialization of an antenna module able to smoothly implement millimeter wave communications is being actively undertaken.

Conventionally, an antenna module providing a millimeter wave communications environment uses a structure in which an integrated circuit (IC) and an antenna are disposed on a board and are connected to each other by a coaxial cable to satisfy a high level of antenna performance (e.g., a transmission and reception rate, a gain, and a directivity) at a high frequency.

However, such a structure may cause a reduction of antenna layout space, a restriction of the degree of freedom of an antenna shape, an increase in interference between the antenna and the IC, and an increase in the size and cost of the antenna module.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an antenna module includes a connection member including at least one wiring layer and at least one insulating layer; an integrated circuit (IC) disposed on a first surface of the connection member and electrically connected to at least one wiring layer of the connection member; and an antenna package disposed on a second surface of the connection member and including first antenna members configured to transmit or receive a radio frequency (RF) signal; and first feed vias each having a first end electrically connected to a corresponding one of the first antenna members, and a second end electrically connected to a corresponding wire of at least one wiring layer of the connection member, wherein the connection member further includes a feed line having a first end electrically connected to a corresponding wire of at least one wiring layer of the connection member; a second antenna member electrically connected to a second end of the feed line and configured to transmit or receive an RF signal; and a ground member spaced apart from the feed line in a direction toward the first surface or the second surface of the connection member.

The second antenna member may be a dipole including a first pole and a second pole, the feed line may include a first feed line electrically connected to the first pole, and a second feed line electrically connected to the second pole, and the ground member may have a width greater than a distance between the first feed line and the second feed line and less than a total dipole length of the first pole and the second pole.

The second antenna member may have an intrinsic frequency band determined by characteristics of the second antenna member, and an expanded frequency band determined by the width of the ground member.

The connection member may further include a second ground member spaced apart from the feed line in a direction opposite to the direction in which the ground member is spaced apart from the feed line so that the feed line is disposed between the ground member and the second ground member.

The connection member may further include a third ground member spaced apart from the second antenna member in a direction toward the first surface or the second surface of the connection member; and a fourth ground member spaced apart from the second antenna member in a direction opposite to the direction in which the third ground member is spaced apart from the second antenna member so that the second antenna member is disposed between the third ground member and the fourth ground member, one of the third ground member and the fourth ground member may be disposed on a same level as the ground member, and a remaining one of the third ground member and the fourth ground member may be disposed on a same level as the second ground member.

The connection member may further include a third ground member spaced apart from the second antenna member in a direction toward the first surface or the second surface of the connection member; and a fourth ground member spaced apart from the second antenna member in a direction opposite to the direction in which the third ground member is spaced apart from the second antenna member so that the second antenna member is disposed between the third ground member and the fourth ground member.

The connection member may further include a fifth ground member disposed closer to the connection member than the second antenna member and connecting the third ground member and the fourth ground member to each other, and the fifth ground member may be disposed to block between a portion of the second antenna member and the ground member and to open between a remaining portion of the second antenna member and the ground member.

The second antenna member may be a dipole including a first pole and a second pole spaced apart from the first pole, the third ground member may have a first gap extending between the first pole and the second pole, and the fourth ground member may have a second gap extending between the first pole and the second pole.

The connection member may further include a pole via connecting one of the first pole and the second pole to one of the third ground member and the fourth ground member.

The connection member may further include a director member disposed between the third ground member and the fourth ground member, extending across the first gap and the second gap, and spaced apart from the second antenna member.

The connection member may further include a second feed via electrically connected between the feed line and the second antenna member, and the ground member may be spaced apart from a side surface of the feed via.

The connection member may further include an impedance conversion line electrically connected between the feed line and the second antenna member, and the ground member may be spaced apart from the impedance conversion line in the direction toward the first surface or the second surface of the connection member.

The connection member may further include a ground layer disposed on a same level as the feed line in the connection member and spaced apart from the feed line; and shielding vias extending from the ground layer to block between at least one wiring layer of the connection member and the second antenna member.

The antenna package may further include a dielectric layer surrounding a side surface of each of the plurality of first feed vias and having a height greater than a height of at least one insulating layer of the connection member; and a plating member disposed in the dielectric layer surrounding the side surface of each of the plurality of first feed vias.

In another general aspect, a dual-band antenna apparatus includes a first feed line having a first end electrically connected to an integrated circuit (IC); a second feed line having a first end electrically connected to the IC; a first pole electrically connected to a second end of the first feed line and configured to transmit or receive a radio frequency (RF) signal; a second pole electrically connected to a second end of the second feed line and configured to transmit or receive the RF signal; a first ground member spaced apart from the first feed line and the second feed line in a first direction; and a second ground member spaced apart from the first feed line and the second feed line in a second direction opposite to the first direction, wherein each of the first ground member and the second ground member has a width greater than a distance between the first feed line and the second feed line, and less than a total dipole length of the first pole and the second pole, and the first pole and the second pole have an intrinsic frequency band of a dipole, and an expanded frequency band different from the intrinsic frequency band determined by the width of the first ground member and the width of the second ground member.

The dual-band antenna apparatus may further include a first arm member covering a first side of the first pole; a second arm member covering a second side of the first pole opposite to the first side of the first pole; a third arm member covering a first side of the second pole; a fourth arm member covering a second side of the second pole opposite to the first side of the second pole; a first pole via connecting the first arm member and the first pole to each other; and a second pole via connecting the third arm member and the second pole to each other.

In another general aspect, an antenna module includes a connection member including wiring layers; a feed line connected to a wire in a wiring layer of the connection member; a first antenna member connected to the feed line and configured to either one or both of transmit a first radio frequency (RF) signal and receive a second RF signal; and a first ground member connected to a wiring layer of the connection member, the first ground member being spaced apart from the feed line, and disposed between the wiring layer to which the first ground member is connected and the first antenna member.

The antenna module may further include a second ground member spaced apart from the first antenna member and the first ground member.

The first ground member may be an extension of the wiring layer to which the first ground member is connected, and may extend in a first direction toward the antenna member; and the first antenna member may be further configured to either one or both of transmit the first RF signal in the first direction and receive the second RF signal in a direction opposite to the first direction.

The antenna module may further include an antenna package disposed on a surface of the connection member, the antenna package including a second antenna member configured to either one or both of transmit a third RF signal in a second direction different from the first direction and receive a fourth RF signal in a direction opposite to the second direction; and a connecting member connecting the second antenna member to a wire in a wiring layer of the connection member, wherein the third RF signal may be the same as or different from the first RF signal, and the fourth RF signal may be the same as or different from the second RF signal.

In another general aspect, an antenna module includes first antenna members disposed in a central portion of the antenna module, the first antenna members facing in a first direction; first antenna apparatuses disposed along a first section of a periphery of the antenna module, each of the first antenna apparatuses including a first feed line extending toward the first section of the periphery of the antenna module; a second antenna member connected to the first feed line and extending substantially parallel to the first section of the periphery of the antenna module, the second antenna member facing in a second direction different from the first direction; and a first ground member spaced apart from the first feed line and extending toward the first section of the periphery of the antenna module;

The antenna module may further include second antenna apparatuses disposed along a second section of the periphery of the antenna module, the second section of the periphery of the antenna module adjoining the first section of the periphery of the antenna module and forming an angle of less than 180° with the first section of the periphery of the antenna module, each of the second antenna apparatuses including a second feed line extending toward the second section of the periphery of the antenna module; a third antenna member connected to the second feed line and extending substantially parallel to the second section of the periphery of the antenna module, the third antenna member facing in a third direction different from the first direction and the second direction; and a second ground member spaced apart from the second feed line and extending toward the second section of the periphery of the antenna module.

The antenna module may further include first chip antennas and first dipole antennas disposed between the first antenna members and the first section of the periphery of the antenna module, the first chip antennas and the first dipole antennas facing in the second direction; and second chip antennas and second dipole antennas disposed between the first antenna members and the second section of the periphery of the antenna module, the second chip antennas and the second dipole antennas facing in the third direction.

In another general aspect, an electronic device includes a case; the antenna module described above disposed in the case so that the first section of the periphery of the antenna module is adjacent to a first side boundary of the case, and the second section of the periphery of the antenna module is adjacent to a second side boundary of the case; and an integrated circuit (IC) configured to receive a baseband signal and generate a radio frequency (RF) signal from the baseband signal, wherein each of the first antenna members is connected to the IC to receive the RF signal from the IC, and is configured to transmit the RF signal in the first direction, each of the second antenna members is connected to the IC to receive the RF signal from the IC, and is configured to transmit the RF signal in the second direction, and each of the third antenna members is connected to the IC to receive the RF signal from the IC, and is configured to transmit the RF signal in the third direction.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
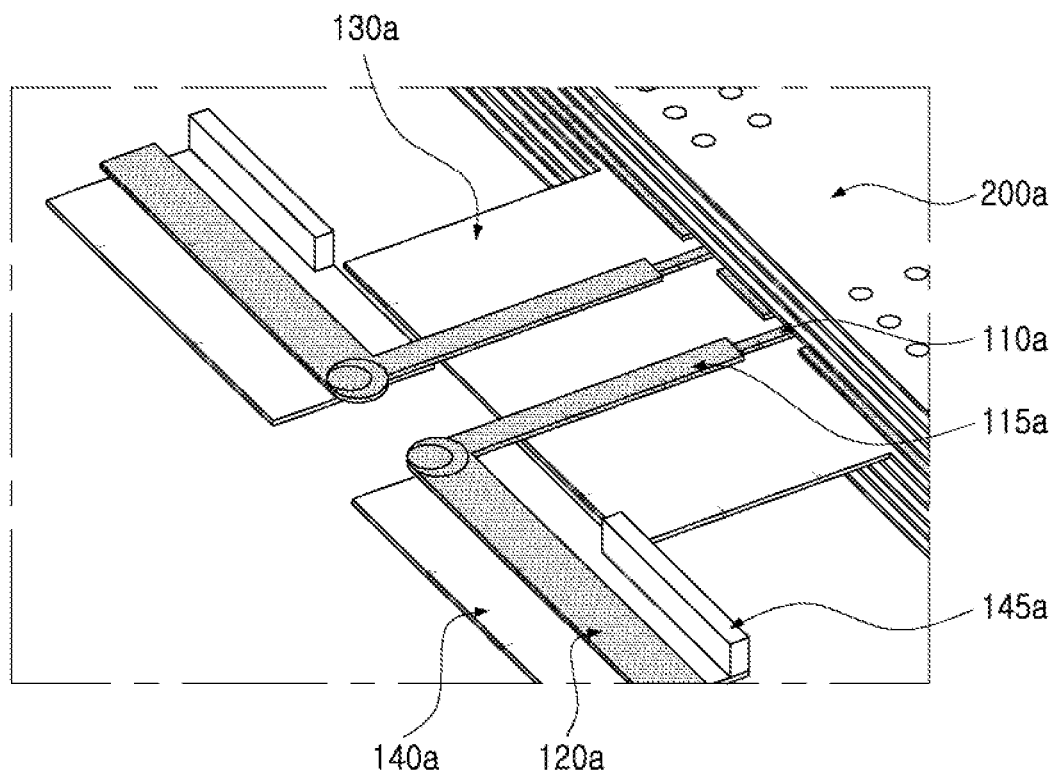
FIG. 1 is a view illustrating an example of an antenna module.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a view illustrating an example of an antenna module.

Referring to FIG. 1, an antenna module includes a connection member 200a. The connection member 200a includes at least one wiring layer and at least one insulating layer, and has a first surface (e.g., a lower surface) on which an integrated circuit (IC) (not illustrated in FIG. 1) is disposed, and a second surface (e.g., an upper surface) on which an antenna package (not illustrated in FIG. 1) is disposed.

The antenna package is implemented to be homogeneous or heterogeneous with respect to the connection member 200a, and transmits or receives a radio frequency (RF) signal in a first direction in which the second surface (e.g., the upper surface) of the connection member 200a on which the antenna package is disposed faces. In the example illustrated in FIG. 1, the antenna package transmits or receives the RF signal in a vertical direction perpendicular to the second surface (e.g., the upper surface) of the connection member 200. Therefore, the antenna module forms a radiation pattern in the first direction so that the RF signal is transmitted or received in the first direction.

Referring to FIG. 1, the antenna module includes a feed line 110a, an antenna member 120a, and a ground member 130a that enable the antenna module to form a radiation pattern in a second direction in which a side surface of the connection member 200a faces to transmit or receive an RF signal in the second direction. In the example illustrated in FIG. 1, the antenna module transmits or receives the RF signal in a horizontal direction perpendicular to the left side surface of the connection member 200. That is, the antenna module omnidirectionally expands the transmission and reception direction of an RF signal.

The feed line 110a is electrically connected to at least one wiring layer of the connection member 200a. That is, the feed line 110a transmits the RF signal to the IC through at least one wiring layer of the connection member 200a, and receives the RF signal from the IC through at least one wiring layer of the connection member 200a, which may be the same as or different from the at least wiring layer through which the feed line transmits the RF signal.

The antenna member 120a is electrically connected to the feed line 110a and is configured to transmit or receive the RF signal. In the example illustrated in FIG. 1, the antenna member 120a is a dipole including a first pole and a second pole. The first pole and the second pole are respectively electrically connected to a first feed line and a second feed line of the feed line 110a.

The antenna member 120a has an intrinsic frequency band (e.g., 28 GHz) determined by characteristics of the antenna member 120 (e.g., a pole length, a pole thickness, a distance between poles, a distance between a pole and a side surface of the connection member 200a, and a dielectric permittivity of an insulating layer).

The ground member 130a is spaced apart from the feed line 110a in a direction toward the first surface (e.g., a downward direction) or the second surface (e.g., an upward direction) of the connection member 200a.

The ground member 130a is electromagnetically coupled to the antenna member 120a and influences frequency characteristics of the antenna member 120a depending on characteristics of the ground member 130a (e.g., a width, a length, a thickness, a distance between the ground member 130a and the feed line 110a, and a degree of electrical isolation between the ground member 130a and the antenna member 120a).

In one example, the ground member 130a causes the antenna member 120a to have an expanded frequency band (e.g., 38 GHz). In another example in which the expanded frequency band of the antenna member 120a is similar to the intrinsic frequency band of the antenna member 120a, the ground member 130a improves a bandwidth or a gain of the intrinsic frequency band of the antenna member 120a.

Therefore, the antenna module of FIG. 1 improves an antenna performance (e.g., a transmission and reception rate, a gain, a bandwidth, and a directivity) in a second direction in which the antenna member 120a transmits or receives an RF signal, and enables dual-band transmission and reception in the second direction.

The antenna module of FIG. 1 further includes an impedance conversion line 115a, a third ground member 140a, and a fifth ground member 145a.

The impedance conversion line 115a is electrically connected between the feed line 110a and the antenna member 120a. For example, the impedance conversion line 115a has a thickness different from a thickness of the feed line 110a so that the impedance conversion line 115a has an impedance different from an impedance of the feed line 110a. In the example illustrated in FIG. 1, the impedance conversion line 115a is directly connected to the antenna member 120a, but depending on a design of the antenna module, the impedance conversion line 115a may be connected to one end of the feed line 110a, or may be disposed adjacent to the center of the connection member 200a.

The third ground member 140a is spaced apart from the antenna member 120a in a direction toward the first surface (e.g., the lower surface) of the connection member 200a. The third ground member 140a is electromagnetically coupled to the antenna member 120a to improve a gain or a transmission and reception rate of the antenna member 120a.

In the example illustrated in FIG. 1, the third ground member 140a includes a plurality of ground patterns separated by a gap corresponding to a form (e.g., a dipole in the example illustrated in FIG. 1) of the antenna member 120a, and has a width equal to or greater than a width of the antenna member 120a to fully oppose an entire lower surface of the antenna member 120a.

The fifth ground member 145a extends in an upward direction from an end portion of the third ground member 140a along an edge of the third ground member 145a closest to the connection member 200a. In the example illustrated in FIG. 1, the fifth ground member 145a is disposed to block between a portion (e.g., an end portion of the dipole) of the antenna member 120a and the ground member 130a, and to open between the remaining portion (e.g., a start portion of the dipole) of the antenna member 120a and the ground member 130a. Accordingly, an electromagnetic coupling of the ground member 130a to the antenna member 120a may be precisely adjusted, and an isolation between the antenna member 120a and the at least one wring layer of the connection member 200a may be improved.

Figure 2:
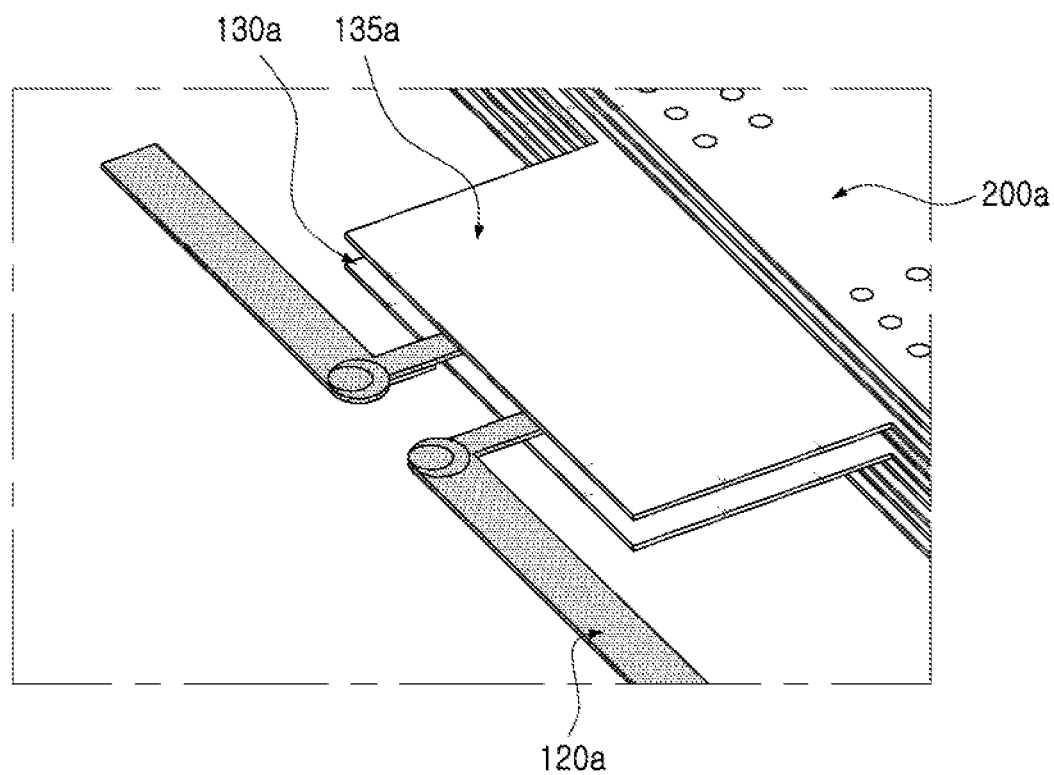
FIG. 2 is a view illustrating an example of an antenna module including a second ground member.

FIG. 2 is a view illustrating an example of an antenna module including a second ground member.

Referring to FIG. 2, an antenna module further includes a second ground member 135a spaced apart from the feed line 110a in a direction toward the second surface (e.g., the upper surface) of the connection member 200a so that the feed line 110a and/or the impedance conversion line 115a are disposed between the ground member 130a and the second ground member 135a.

The second ground member 135a is electromagnetically coupled to the antenna member 120a and influences frequency characteristics of the antenna member 120a depending on the characteristics of the second ground member 135a (e.g., a width, a length, a thickness, a distance between the second ground member 135a and the feed line 110a, and a degree of electrical isolation between the second ground member 135a and the antenna member 120a).

The second ground member 135a may have the same form as the ground member 130a, or may have a form different from the form of the ground member 130a, or may be omitted according to design factors (e.g., a detailed wiring layout of the connection member 200a, whether or not an IC package is mounted on the connection member 200a, characteristics of the antenna member 120a, frequency characteristics of an RF signal transmitted or received by the antenna member 120a, a process of manufacturing an antenna module, an entire size of the antenna module, and a manufacturing cost of the antenna module).

Either one or both of the third ground member 140a and the fifth ground member 145a illustrated in FIG. 1 may also be omitted according to the design factors referred to above.

Figure 3:
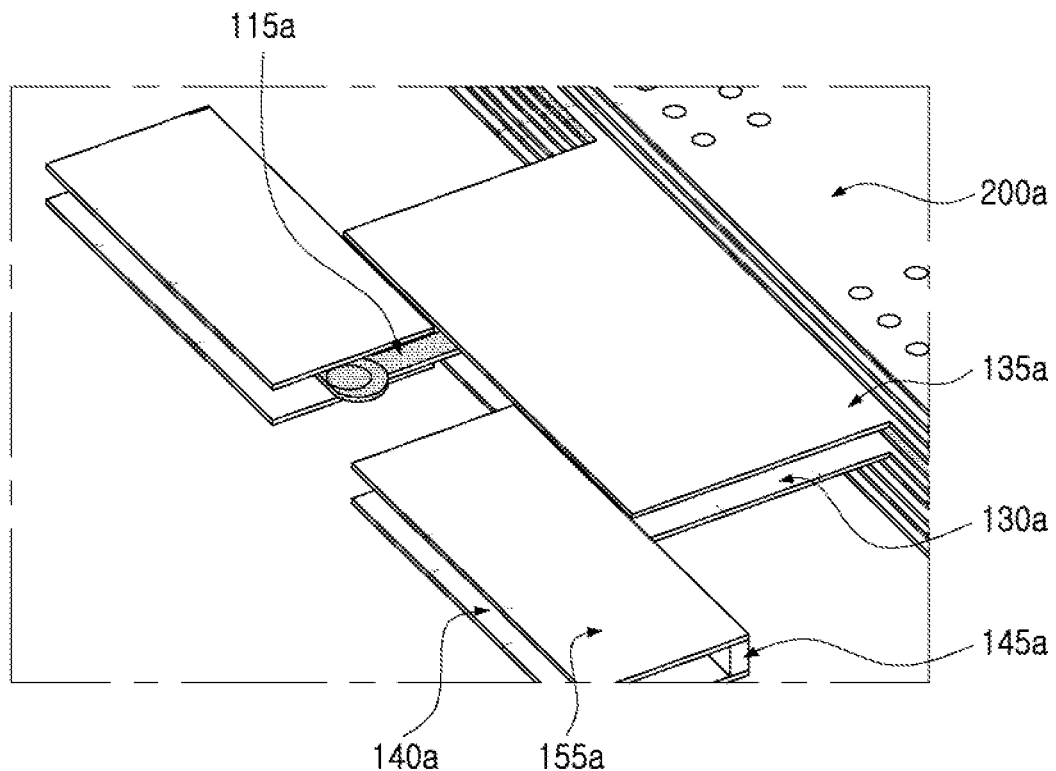
FIG. 3 is a view illustrating an example of an antenna module including third and fourth ground members.

FIG. 3 is a view illustrating an example of an antenna module including third and fourth ground members.

Referring to FIG. 3, an antenna module further includes a fourth ground member 155a spaced apart from the antenna member 120a in a direction toward the second surface (e.g., the upper surface) of the connection member 200a. The third ground member 140a may be disposed on a same level as the ground member 130a, and the fourth ground member 155a may be disposed on a same level as the second ground member 135a. The fifth ground member 155a connects the third ground member 140a and the fourth ground member 155a to each other. The fourth ground member 155a is electromagnetically coupled to the antenna member to improve a gain or a transmission and reception rate of the antenna member.

In addition, since the antenna member 120a is disposed between the third ground member 140a and the fourth ground member 155a, a directivity of a radiation pattern of the antenna member 120a is improved.

Figure 4:
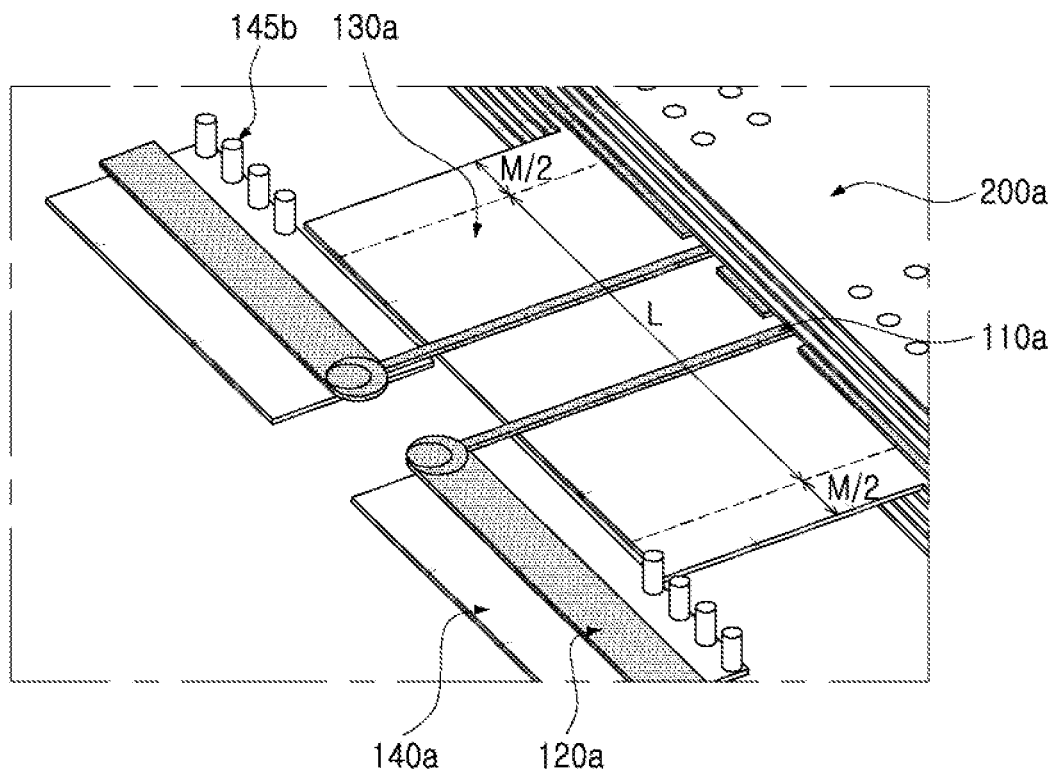
FIG. 4 is a view illustrating an example of an antenna including a fifth ground member, and a width of a ground member.

FIG. 4 is a view illustrating an example of an antenna module including a fifth ground member, and a width of a ground member.

Referring to FIG. 4, a fifth ground member 145b of an antenna module is implemented as a structure in which a plurality of vias are disposed along a straight line and are parallel to each other. However, this is only one example, and the plurality of vias may be arranged in other ways.

In the example illustrated in FIG. 4, a width of the ground member 130a is matched to a position a first via of the fifth ground member 145b, that is, a via of the fifth ground member 145b closest to the feed line 110a.

In one example, the ground member 130a has a small width (e.g., L) to increase an expanded frequency band of the antenna member 120a. In another example, the ground member has a large width (e.g., L+M/2+M/2) to decrease the expanded frequency band of the antenna member 120a.

Figure 5:
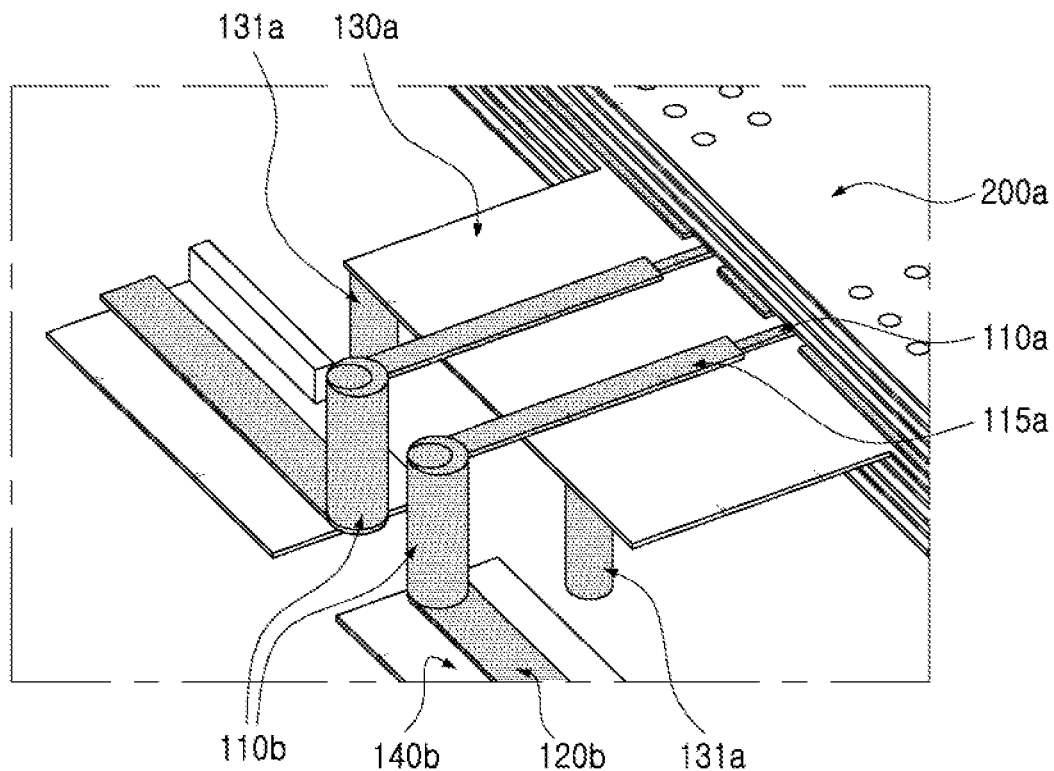
FIG. 5 is a view illustrating an example of an antenna module including a feed via.

FIG. 5 is a view illustrating an example of an antenna module including a feed via.

Referring to FIG. 5, an antenna module further includes a feed via 110b electrically connected between the feed line 110a and an antenna member 120b. The ground member 130a is spaced apart from the feed via 110b in a direction toward a side surface of the connection member 200a.

The feed via 110b enables the antenna member 120b to be disposed at a lower position relative to the ground member 130a than the antenna member 120a illustrated in FIGS. 1 through 4, and also to be disposed below a first surface (e.g., a lower surface) of the connection member 200a depending on a design of the antenna module. Accordingly, the antenna member 120b forms a radiation pattern at a lower position than the antenna member 120a illustrated in FIGS. 1 through 4, thereby enabling the transmission and reception direction of the RF signal of the antenna module to be more efficiently expanded.

The antenna module of FIG. 5 further includes a ground via 131a extending downward from a lower surface of the ground member 130a to an upper surface of a third ground member 140b to connect the ground member 130a to the third ground member 140b.

Figure 6:
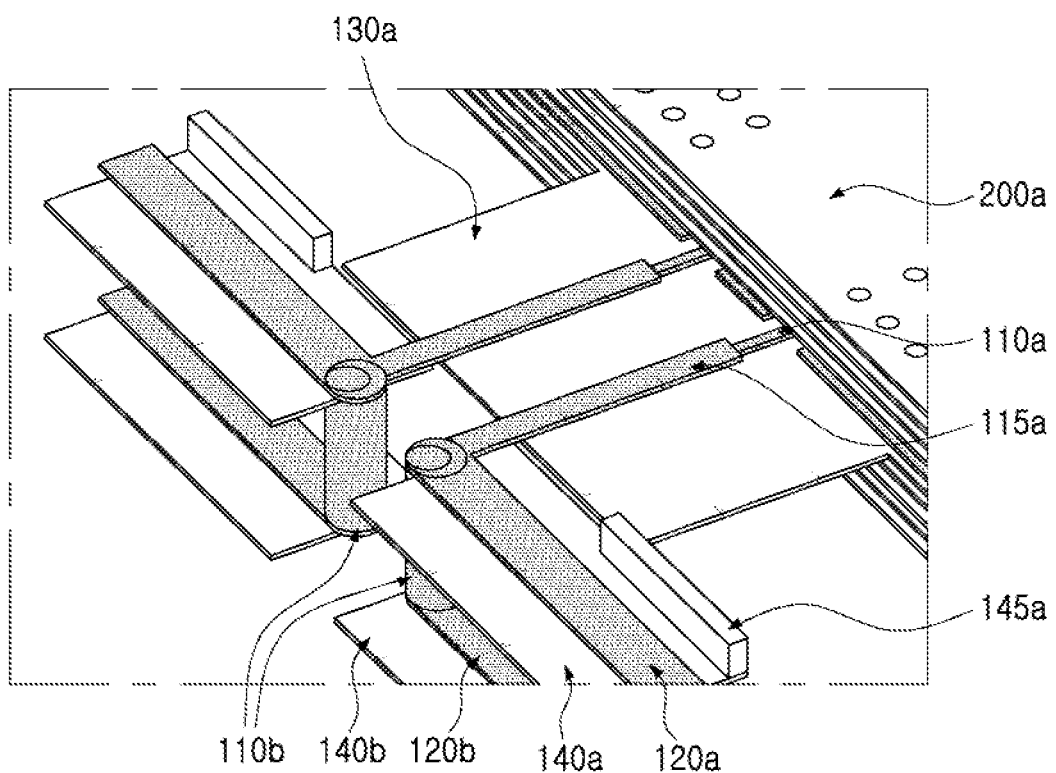
FIG. 6 is a view illustrating an example of an antenna module including a plurality of dipoles.

FIG. 6 is a view illustrating an example of an antenna module including a plurality of dipoles.

Referring to FIG. 6, an antenna module includes a plurality of antenna members 120a and 120b disposed parallel to each other. The plurality of antenna members 120a and 120b are electrically connected to each other by the feed via 110b.

In addition, the antenna module further includes a plurality of third antenna members 140a and 140b respectively spaced apart from the plurality of antenna members 120a and 120b in a downward direction.

Accordingly, since a space occupied by each of the plurality of antenna members 120a and 120b may be efficiently distributed in the connection member 200a, the antenna module further improves an antenna performance and prevents an excessive size expansion of the antenna module.

Figure 7:
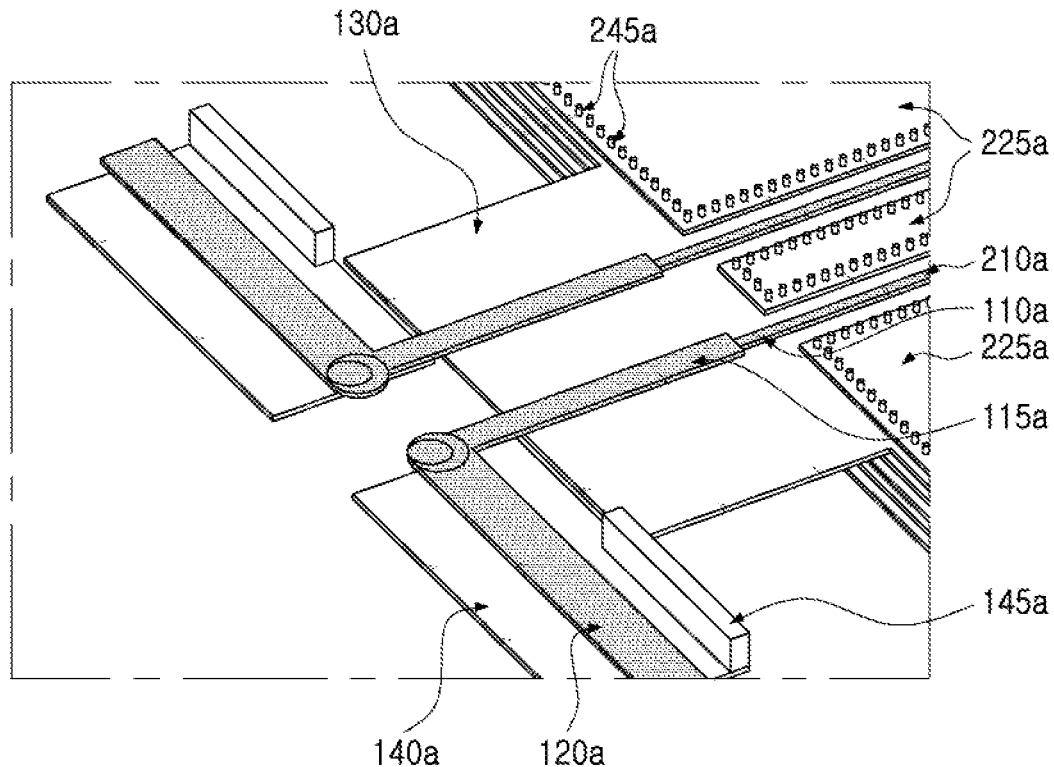
FIG. 7 is a view illustrating an example of an antenna module including a ground layer and a plurality of shielding vias.

FIG. 7 is a view illustrating an example of an antenna including a ground layer and a plurality of shielding vias.

Referring to FIG. 7, the antenna module includes a ground layer 225a disposed at a same level as the feed line 110a in the connection member and spaced apart from the feed line 110a.

The ground layer 225a acts as a reflector with respect to the antenna member 120a. That is, the ground layer 225a improves an antenna performance of the antenna member 120a.

In addition, the antenna module further includes a plurality of shielding vias 245a extending upward from the ground layer 225a to block between a wiring layer 210a and the antenna member 120a.

The plurality of shielding vias 245a reduce a transmission loss of the RF signal of the wiring layer 210a, act as reflectors with respect to the antenna member 120a, and improve an isolation between the antenna member 120a and the wiring layer 210a.

Figure 8:
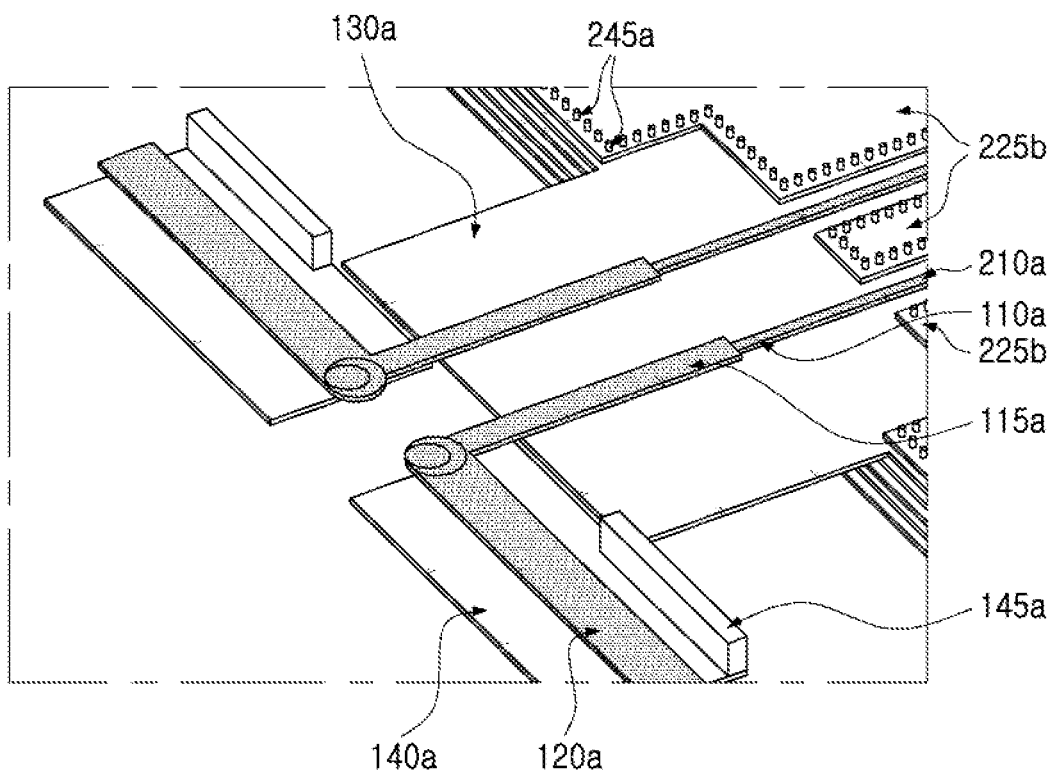
FIG. 8 is a view illustrating an example of an antenna module including a ground layer having a different form.

FIG. 8 is a view illustrating an example of an antenna module including a ground layer having a different form.

Referring to FIG. 8, a portion of a boundary of a ground layer 225b closest to the antenna member 120a and crossing the ground member 130a is closer to the center of the connection member than in the example illustrated in FIG. 7, thereby increasing a length of the ground member 130a. Accordingly, since the length of the ground member 130a is extended, the antenna member 120a and the third ground member 140a may be disposed closer to the center of the connection member than in the example illustrated in FIG.

7, thereby enabling an area of the connection member to be reduced. Accordingly, a size of the antenna module may also be reduced.

In the example illustrated in FIG. 8, the ground layer 225b has a form obtained by removing a partial region of the ground layer 225a illustrated in FIG. 7. A width of the partial region corresponds to the width of the ground member 130a, and a length of the partial region may be varied according to any one or any combination of any two or more of a layout position of the antenna member 120a, a frequency band, and a detailed wiring layout of the connection member.

Figure 9:
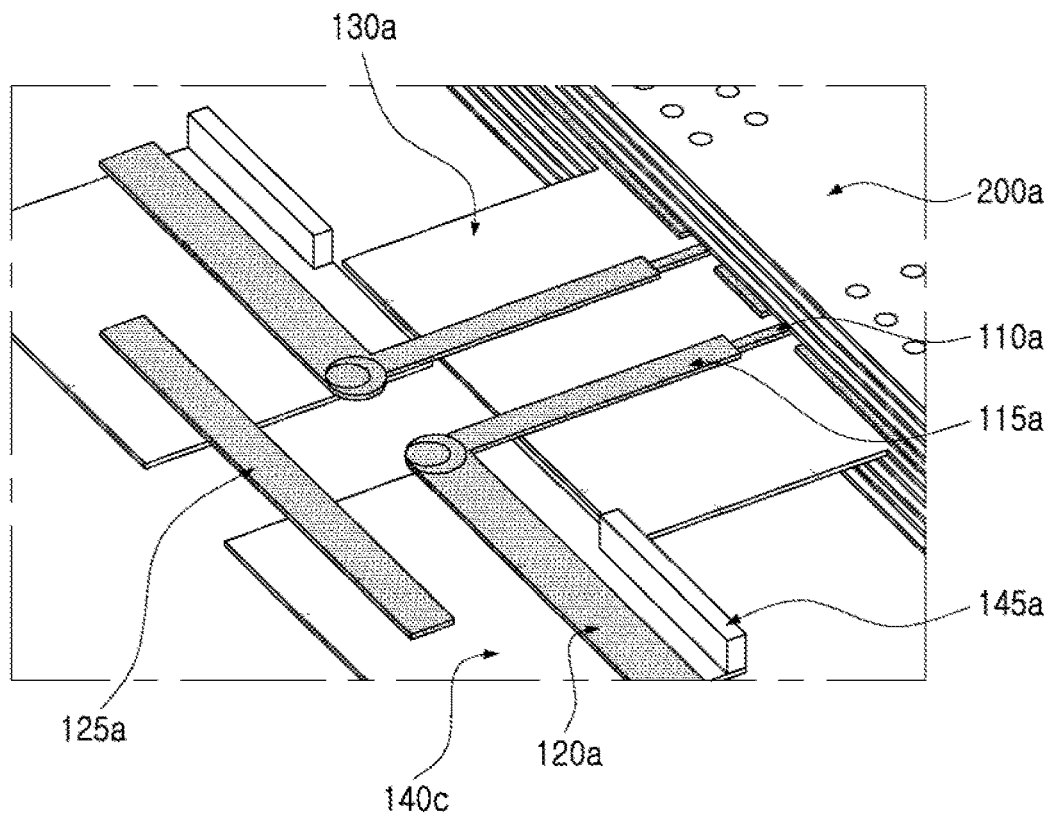
FIG. 9 is a view illustrating an example of an antenna module including a director member.

FIG. 9 is a view illustrating an example of an antenna module including a director member.

Referring to FIG. 9, the antenna module further includes a director member 125a spaced apart from the third ground member 140c in a direction toward the second surface (e.g., the upper surface) of the connection member 200a, extending across a gap in the third ground member 140c, and spaced apart from the antenna member 120a in a direction away from the connection member 200a. In one example, the director member 125a is disposed on a same level as the antenna member 120a, but is not limited thereto.

The director member 125a is electromagnetically coupled to the antenna member 120a to improve a gain or a bandwidth of the antenna member 120a. The director member 125a has a length less than a total dipole length of the antenna member 120a, and the electromagnetic coupling between the antenna member 120a and the director member 125a increases as the length of the director member 125a decreases. Accordingly, a directivity of the antenna member 120a is further improved.

Figure 10:
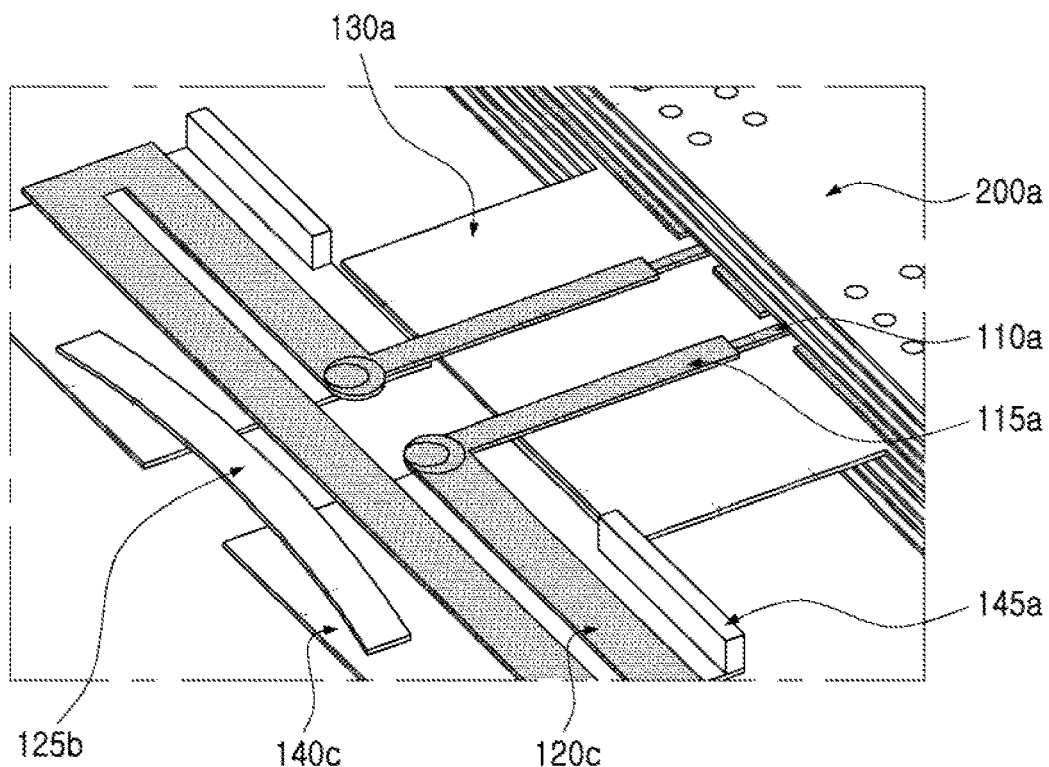
FIG. 10 is a view illustrating an example of an antenna module including a folded dipole and a director member having a different form.

FIG. 10 is a view illustrating an example of an antenna including a folded dipole and a director member having a different form.

Referring to FIG. 10, an antenna member 120c included in the antenna module is a folded dipole, and a director member 125b included in the antenna module is curved.

If necessary, a size of the third ground member 140c is greater than a size of the third ground member 140c illustrated in FIG. 9 to accommodate the expanded form of the antenna member 120c and the expanded form of the director member 125b.

Figure 11A:
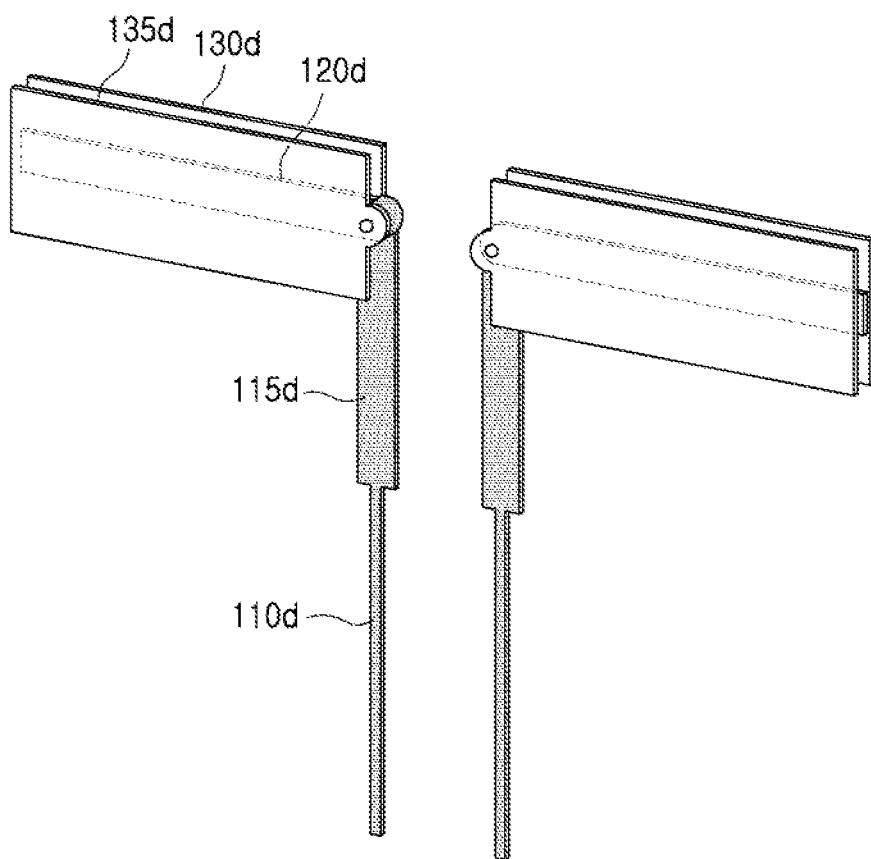
FIGS. 11A and 11B are views illustrating an example of a dual-band antenna apparatus.
Figure 11B:
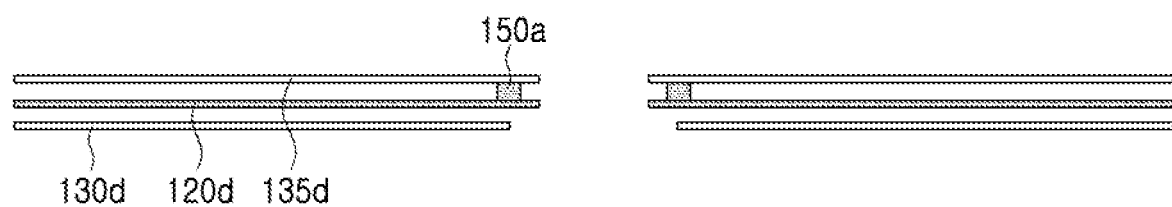

FIGS. 11A and 11B are views illustrating an example of a dual-band antenna apparatus.

Referring to FIG. 11A, a dual-band antenna apparatus includes a feed line 110d, an impedance conversion line 115d, a pole 120d, arm members 130d and 135d, and a ground member (not illustrated in FIG. 11A, but see FIGS. 1 through 10 for examples).

The feed line 110d is electrically connected to an IC (not illustrated in FIG. 11A). The feed line 110d includes first and second feed lines having a bilaterally symmetric structure.

The pole 120d is electrically connected to the feed line 110d and configured to transmit or receive an RF signal. The pole 120d has an intrinsic frequency band determined by characteristics of the pole 120d. In the example illustrated in FIG. 11A, the pole 120d is implemented as first and second poles having a bilaterally symmetric structure.

The ground member is spaced apart from the feed line 110d in a direction toward an upper surface or a lower surface of a connection member (not illustrated in FIG. 11A but see FIGS. 1 through 10 for examples), and has a width greater than a distance between the first and second feed lines of the feed line 110d, and is less than a total dipole length of the first and second poles of the pole 120d.

The ground member is electromagnetically coupled to the pole 120d, and the width of the ground member influences frequency characteristics of the pole 120d to provide the pole 120d with an expanded frequency band.

Therefore, the dual-band antenna apparatus is able to transmit and receive a dual-band RF signal within the expanded frequency band while having a simplified structure.

The arm members 130d and 135d oppose opposite sides of the pole 120d so as to be electromagnetically coupled to the pole 120d. In the example illustrated in FIG. 11A, the arm member 130d covers one side of the pole 120d, and the arm member 135d covers the opposite side of the pole 120.

Referring to FIG. 11B, the dual-band antenna apparatus further includes a pole via 150a connecting the arm member 135d and the pole 120d to each other.

The pole via 150a adjusts a direction of current flowing in the pole 120d. For example, the pole via 150a adjusts an electrical distance of one of the first and second poles of the pole 120d so that a current direction or a phase of each of the first and second poles of the pole 120d is the same.

The pole via 150a may be included in the antenna modules illustrated in FIGS. 1 through 10 to connect the antenna member and the third or fourth ground member to each other, and perform the same function performed by the pole via 150a in the dual-band antenna apparatus of FIGS. 11A and 11B.

Figure 12:
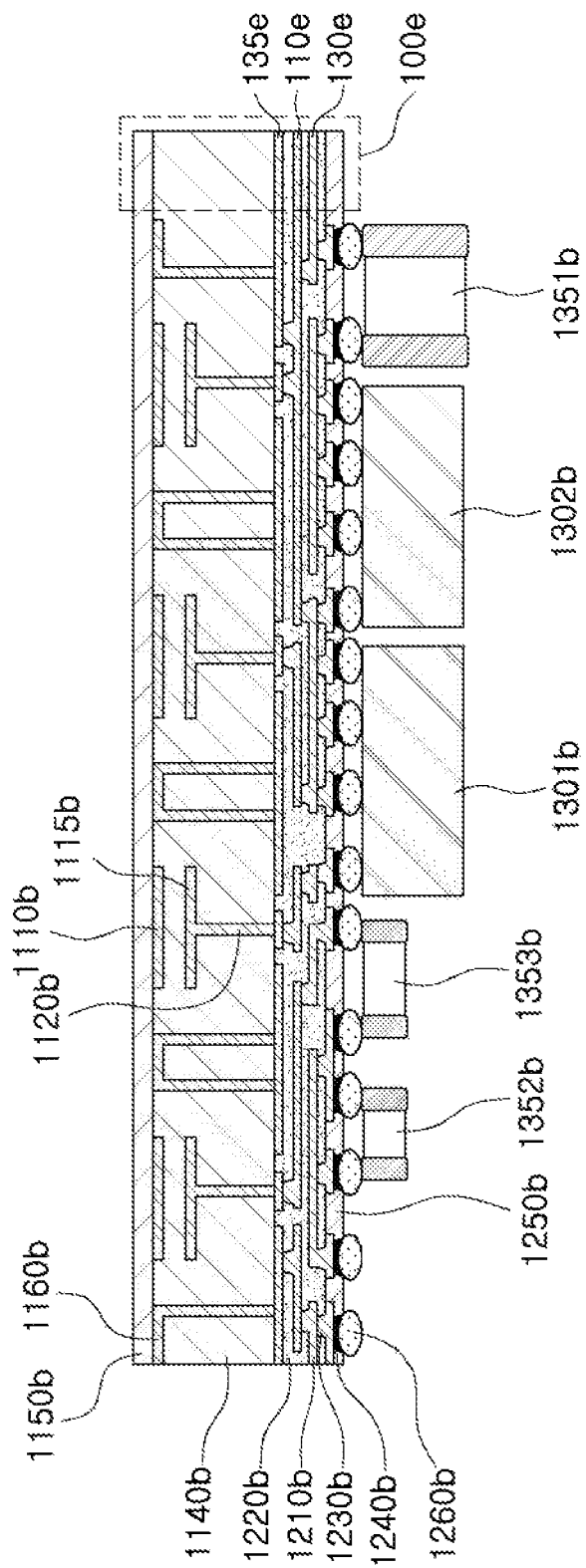
FIG. 12 is a view illustrating an example of an antenna module including an integrated circuit (IC) and an antenna package.

FIG. 12 is a view illustrating an example of an antenna including an integrated circuit (IC) and an antenna package.

Referring to FIG. 12, the antenna module has a heterogeneous structure in which an antenna package and a connection member are connected to each other. That is, the antenna module may be miniaturized while improving an antenna performance (e.g., a transmission and reception rate, a gain, and a directivity) by utilizing both characteristics that make it possible to improve the antenna performance of the antenna package and characteristics that make it possible to dispose a circuit pattern or an integrated circuit (IC) of the connection member.

The connection member includes at least one wiring layer 1210b and at least one insulating layer 1220b. The connection member includes a wiring via 1230b connected to at least one wiring layer 1210b and a connection pad 1240b connected to the wiring via 1230b. The connection pad 1240b may have a structure similar to a copper redistribution layer (RDL). In the example illustrated in FIG. 12, the antenna package is disposed on an upper surface of the connection member.

The antenna package includes a plurality of director members 1110b, a plurality of antenna members 1115b, a plurality of feed vias 1120b, a dielectric layer 1140b, an encapsulation member 1150b, and a plating member 1160b.

The plurality of director members 1110b are disposed adjacent to one surface of the antenna module (an upper surface of the antenna module in the example illustrated in FIG. 12), and receive an RF signal or transmit the RF signal generated by an IC 1301b together with corresponding ones of the plurality of antenna members 1115b disposed below the plurality of director members 1110b.

Depending on a design of the antenna package, the plurality of director members 1110b may be omitted, or at least one additional director member may be further disposed above each of the plurality of director members 1110b.

The plurality of antenna members 1115b are electromagnetically coupled to the plurality of director members 1110b disposed above the plurality of antenna members 1115b, and receive the RF signal or transmit the RF signal generated by the IC 1301b together with corresponding ones of the plurality of director members 1110b. In one example, the plurality of antenna members 1115b have a shape (e.g., a patch antenna) similar to a shape of corresponding ones of the plurality of director members 1110b.

The plurality of feed vias 1120b are electrically connected to the plurality of antenna members 1115b to provide a path for the RF signal. The plurality of feed vias 1120b have a length greater than a thickness of at least one insulating layer 1220b of the connection member. Accordingly, a transmission efficiency of the RF signal is improved.

The dielectric layer 1140b surrounds a side surface of each of the plurality of feed vias 1120b. The dielectric layer 1140b has a height greater than a height of at least one insulating layer 1220b of the connection member. The antenna performance of the antenna package improves as a height and/or a width of the dielectric layer 1140b increases, and the antenna package provides boundary conditions (e.g., a small manufacturing tolerance, a short electrical length, a smooth surface, a large size of the dielectric layer, and an adjustment of a dielectric constant) that are advantageous in a transmission and reception operation of an RF signal of the plurality of antenna members 1115b.

In one example, the dielectric layer 1140b and at least one insulating layer 1220b are made of a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, a prepreg, Ajinomoto Build-up Film (ABF), FR-4, bismaleimide triazine (BT), a photo-imageable dielectric (PID) resin, a generic copper clad laminate (CCL), a glass-based insulating material, or a ceramic-based insulating material.

The dielectric layer 1140a has a dielectric constant greater than a dielectric constant Dk of at least one insulating layer 1220b of the connection member. In one example, the dielectric layer 1140a is made of glass, ceramic, or silicon having a large dielectric constant (e.g., 5 or more), and at least one insulating layer 1220b of the connection member is made of copper clad laminate (CCL) or a prepreg having a relatively small dielectric constant.

The encapsulation member 1150b is disposed on the dielectric layer 1140b, and improves a durability of the plurality of antenna members 1115b and the plurality of director members 1110b against impact or oxidation. In one example, the encapsulation member 1150b is made of a photo-imageable encapsulant (PIE), Ajinomoto Build-Up Film (ABF), or an epoxy molding compound (EMC), but is not limited thereto.

The plating member 1160b is disposed in the dielectric layer 1140b surrounding a side surface of each of the plurality of feed vias 1120b. That is, the plating member 1160b forms a plurality of cavities respectively corresponding to the plurality of antenna members 1115b to provide a boundary condition for transmission and reception of the RF signal by the plurality of antenna members 1115.

The IC 1301b, a power management integrated circuit (PMIC) 1302b, and a plurality of passive components 1351b, 1352b, and 1353b are disposed on a lower surface of the connection member. However, this is merely one example, and the components disposed on the lower surface of the connection member are not limited to these components.

The IC 1301b generates an RF signal transmitted to the plurality of antenna members 1115b and receives an RF signal from the plurality of antenna members 1115b.

The PMIC 1302b generates power and transmits the generated power to the IC 1301b through at least one wiring layer 1210b of the connection member.

The plurality of passive components 1351b, 1352b, and 1353b provide an impedance to either one or both of the IC 1301b and the PMIC 1302b. For example, the plurality of passive components 1351b, 1352b, and 1353b may include any one or any combination of a capacitor (e.g., a multilayer ceramic capacitor (MLCC)), an inductor, and a chip resistor.

In the example illustrated in FIG. 12, the IC 1301b, the power management integrated circuit (PMIC) 1302b, and the plurality of passive components 1351b, 1352b, and 1353b are connected to the connection member through an electrical connection structure 1260b and a passivation layer 1250b, but the electrical connection structure 1260b and the passivation layer 1250b may be omitted depending on a design of the IC 1301b, the power management integrated circuit (PMIC) 1302b, and the plurality of passive components 1351b, 1352b, and 1353b.

The connection member includes an antenna apparatus 100e including a feed line 110e, a second antenna member (not illustrated in FIG. 12) connected to the feed line 110e, a ground member 130e, and a second ground member 135e. The feed line 110e, the second antenna member, the ground member 130e, and the second ground member 135e are similar to the feed line, the antenna member, the ground member, and the second ground member, respectively, described above with reference to FIGS. 1 through 11B, and the antenna apparatus 100e may further include the impedance conversion line, the third, fourth, and fifth ground members, the ground layer, and the shielding vias described above with reference to FIGS. 1 through 11B.

Depending on a design of the antenna package, the antenna package may be implemented to be homogeneous with the connection member. For example, the antenna package may include a plurality of antenna members each implemented by a metal pattern in a layer of the connection member, and a plurality of feed vias each implemented by a plurality of vias of the connection member connected together in the vertical direction. Whether or not the antenna package is implemented to be homogeneous with the connection member may be determined depending on characteristics of the dielectric layer 1140b.

Figure 13:
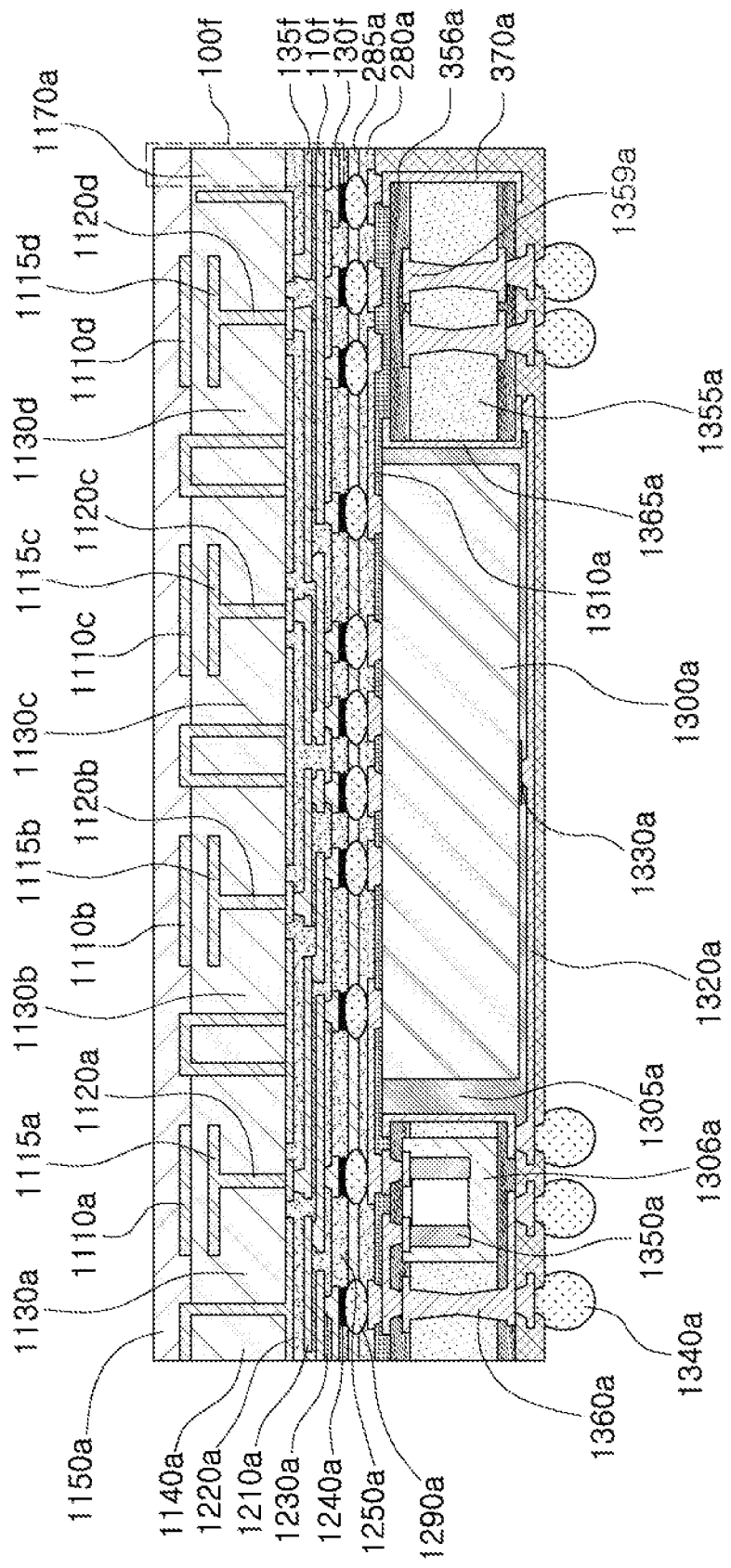
FIG. 13 is a view illustrating an example of an antenna module including an IC package.

FIG. 13 is a view illustrating an example of an antenna module including an IC package.

Referring to FIG. 13, an IC package includes an IC 1300a, an encapsulant 1305a encapsulating at least a portion of the IC 1300a, a core member 1355a disposed so that a first side surface thereof faces the IC 1300a, and a connection member including at least one wiring layer 1310a and an insulating layer 280a. The connection member of the IC package is electrically connected to the IC 1300a and the core member 1355a, and is connected to another connection member as illustrated in FIG. 13, or an antenna package.

The connection member to which the IC package is connected includes at least one wiring layer 1210a, at least one insulating layer 1220a, a wiring via 1230a, a connection pad 1240a, and a passivation layer 1250a. The antenna package includes a plurality of director members 1110a, 1110b, 1110c, and 1110d, a plurality of antenna members 1115a, 1115b, 1115c, and 1115d, a plurality of feed vias 1120a, 1120b, 1120c, and 1120d, a plurality of cavities 1130a, 1130b, 1130c, and 1130d, a dielectric layer 1140a, an encapsulation member 1150a, and a plating member 1170a.

The IC package is connected to the connection member described above. A first RF signal generated by the IC 1300a included in the IC package is transmitted to the antenna package through at least one wiring layer 1310a to be transmitted in an upward direction from the antenna package, and a first RF signal received in a downward direction by the antenna package is transmitted to the IC 1300a through at least one wiring layer 1310a.

The IC package further includes connection pads 1330a disposed on an upper surface and/or a lower surface of the IC 1300a. The connection pads 1330a disposed on the upper surface of the IC 1300a are electrically connected to at least one wiring layer 1310a, and the connection pads 1330a disposed on the lower surface of the IC 1300a are electrically connected to the core member 1355a or a core plating member 1365a through a wiring layer 1320a. The core plating member 1365a provides a ground region for the IC 1300a.

The core member 1355a includes a core dielectric layer 356a in contact with the connection member of the IC package, core wiring layers 1359a disposed on an upper surface and/or a lower surface of the core dielectric layer 356a, and at least one core via 1360a penetrating through the core dielectric layer 356a, and electrically connected to the core wiring layers 1359a and the connection pads 1330a. At least one core via 1360a is electrically connected to an electrical connection structure 1340a such as a solder ball, a pin, or a land.

Accordingly, the core member 1355a receives a baseband signal and/or power from a lower surface thereof, and may transmits the baseband signal and/or power to the IC 1300a through at least one wiring layer 1310a of the connection member.

The IC 1300a generates an RF signal in a millimeter wave (mmWave) band using the baseband signal and/or power. For example, the IC 1300a receives a baseband signal having a low frequency and performs frequency conversion, amplification, filtering phase control, and power generation of the baseband signal, and may be made of a compound semiconductor (e.g., GaAs) or an elemental semiconductor (e.g., silicon) in consideration of high frequency characteristics.

The IC package further includes a passive component 1350a electrically connected to a corresponding wire of at least one wiring layer 1310a. The passive component 1350a is disposed in an accommodation space 1306a provided by the core member 1355a and provides an impedance to the IC 1300a and/or at least one second antenna member (not illustrated in FIG. 13). In one example, the passive component 1350a includes a multilayer ceramic capacitor (MLCC), an inductor, or a chip resistor.

The IC package includes core plating members 1365a and 370a disposed on side surfaces of the core member 1355a. The core plating members 1365a and 370a provide a ground region for the IC 1300a, and radiate heat produced by the IC 1300a to the outside or remove noise generated by the IC 1300a.

The IC package and the antenna package may be manufactured independently of each other and then connected together, or may be manufactured as a single unit depending on a design of the IC package and the antenna package. That is, a separate process of connecting together the IC package and the antenna package may be omitted.

In the example illustrated in FIG. 13, the IC package is connected to the connection member through an electrical connection structure 1290a and a passivation layer 285a, but the electrical connection structure 1290a and the passivation layer 285a may be omitted depending on a design of the IC package.

The connection member includes an antenna apparatus 100f including a feed line 110f, a second antenna member (not illustrated in FIG. 13) connected to the feed line 110f, a ground member 130f, and a second ground member 135f. The feed line 110f, the second antenna member, the ground member 130f, and the second ground member 135f are similar to the feed line, the antenna member, the ground member, and the second ground member, respectively, described above with reference to FIGS. 1 through 11B, and the antenna apparatus 100f may further include the impedance conversion line, the third, fourth, and fifth ground members, the ground layer, and the shielding vias described above with reference to FIGS. 1 through 11B.

Figure 14:
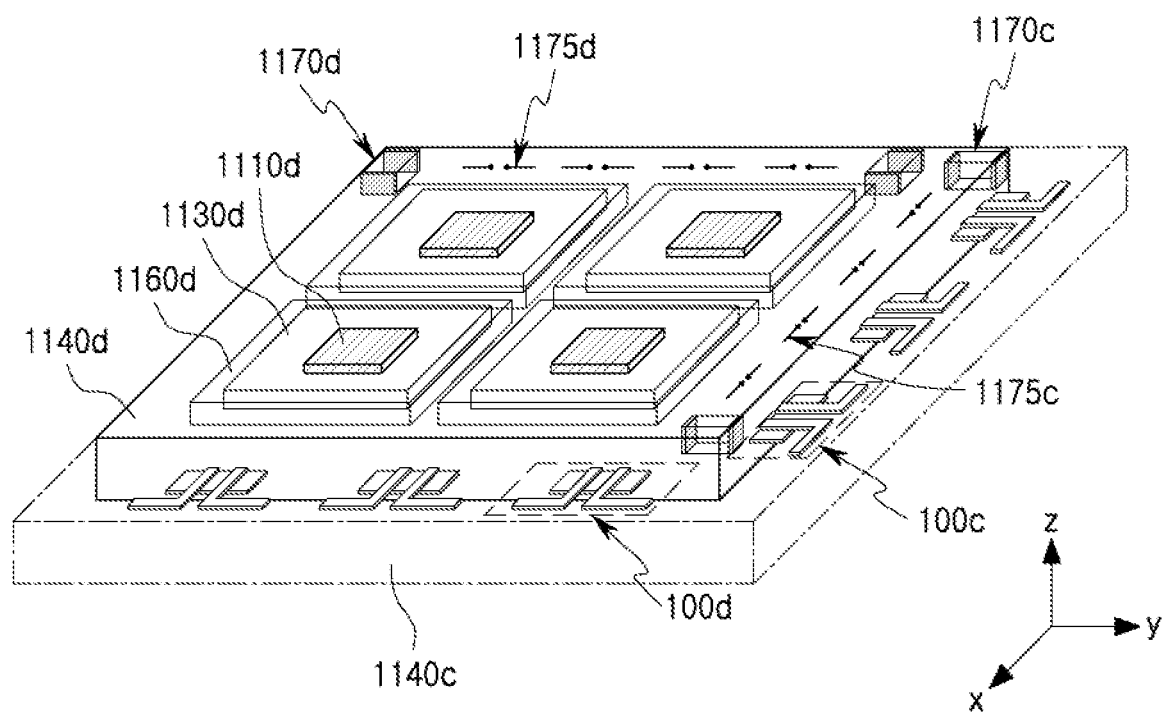
FIG. 14 is a view illustrating an example of layout positions of an antenna module and a dual-band antenna apparatus.

FIG. 14 is a view illustrating an example of layout positions of an antenna module and a dual-band antenna apparatus.

Referring to FIG. 14, an antenna module includes a plurality of director members 1110d, a cavity 1130d, a dielectric layer 1140d, a plating member 1160d, a plurality of chip antennas 1170c and 1170d, and a plurality of dipole antennas 1175c and 1175d.

The plurality of director members 1110d transmit and receive an RF signal in a z axis direction together with corresponding antenna members (not illustrated in FIG. 14 but similar to the antenna members 1115b in FIG. 12 and the antenna members 1115a, 1115b, 1115c, and 1115d in FIG. 13) disposed beneath the plurality of director members 1110d. The number, layout, and form of the plurality of director members 1110d and the plurality of antenna members disposed beneath the plurality of director members 1110d are not limited to any particular configuration. For example, the plurality of director members 1110d may have a circular shape, rather than a square shape as illustrated in FIG. 14, and the number of plurality of director members 1110d may be two, three, or five or more, rather than four as illustrated in FIG. 14.

The plurality of chip antennas 1170c and 1170d are disposed adjacent to an edge of the antenna package and extend in a z axis direction. Some of the plurality of chip antennas 1170c and 1175d transmit and receive the RF signal in an x axis direction, and remaining ones of the plurality of chip antennas 1170c and 1175d transmit and receive the RF signal in a y axis direction. Since the plurality of chip antennas 1170c and 1175d are disposed in the antenna package, the antenna module significantly reduces a problem of a size increase due to an increase in the number of plurality of chip antennas 1170c and 1170d.

The plurality of dipole antennas 1175c and 1175d are disposed between the dielectric layer 1140d and an encapsulation member (not illustrated in FIG. 14) to be disposed adjacent to the edge of the antenna package. Some of the plurality of dipole antennas 1175c and 1175d transmit and receive an RF signal in the x axis direction, and remaining ones of the plurality of dipole antennas 1175c and 1175d transmit and receive the RF signal in the y axis direction. Depending on a design, at least some of the plurality of dipole antennas 1175c and 1175d may be replaced with a monopole antenna.

In addition, the antenna module includes a plurality of antenna apparatuses 100c and 100d each including a feed line, a second antenna member, and a ground member. Some of the plurality of antenna apparatuses 100c and 100d transmit and receive an RF signal in the x axis direction, and remaining ones of the plurality of antenna apparatuses 100c and 100d transmit and receive the RF signal in the y axis direction.

The plurality of antenna apparatuses 100c and 100d may be arranged to be parallel to a side direction of the antenna module and may be encapsulated by a dielectric layer 1140c.

Figure 15A:
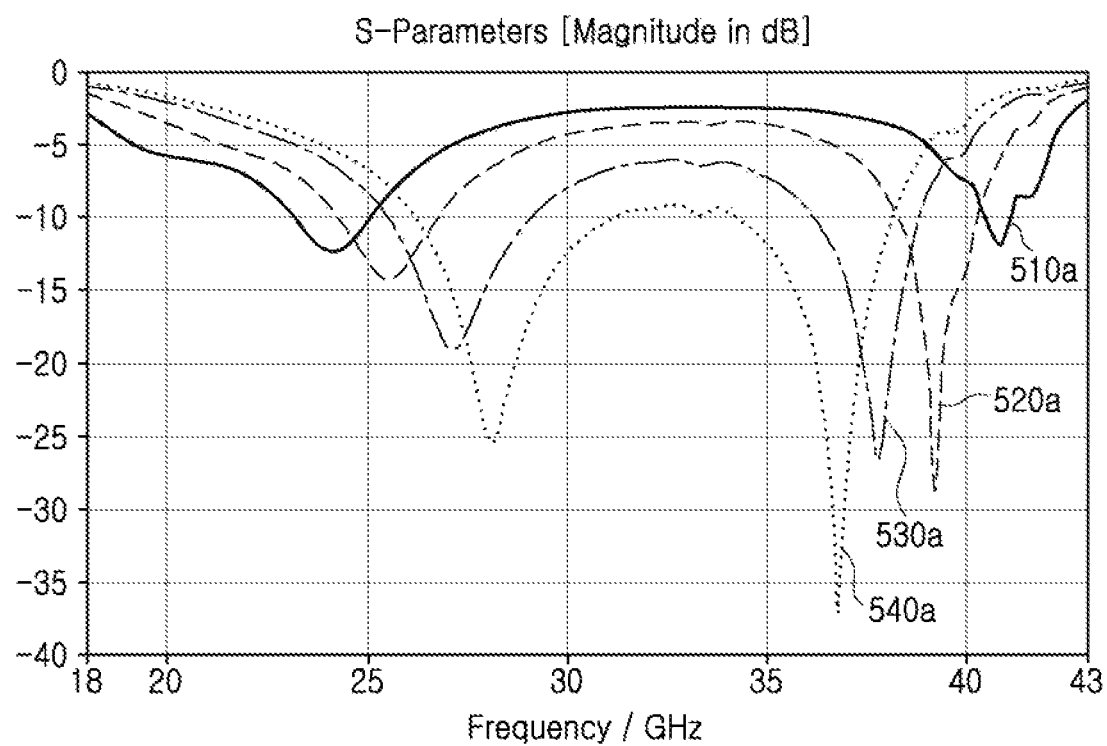
FIGS. 15A and 15B are graphs respectively illustrating S-parameters and gains as a function of frequency of an antenna module and a dual-band antenna apparatus.
Figure 15B:
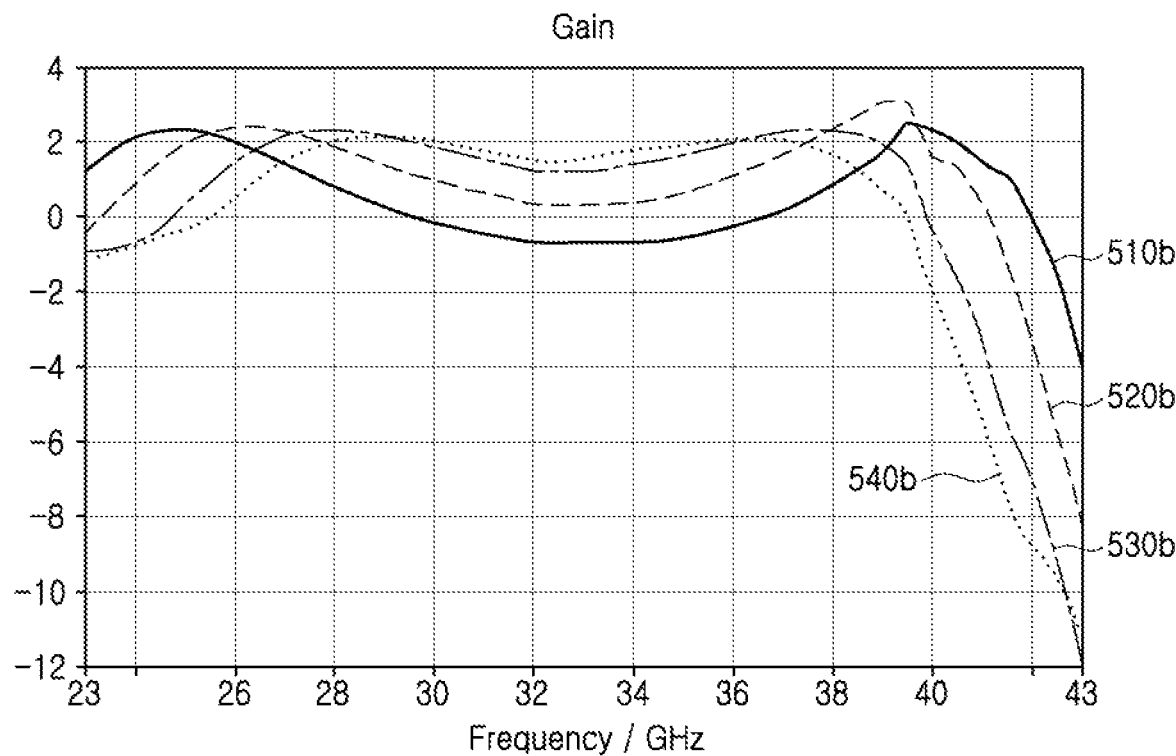

FIGS. 15A and 15B are graphs respectively illustrating S-parameters and gains as a function of frequency of an antenna module and a dual-band antenna apparatus.

Referring to FIGS. 15A and 15B, among first cases 510a and 510b having the shortest width of the ground member, second cases 520a and 520b having the second shortest width of the ground member, third cases 530a and 530b having the second longest width of the ground member, and fourth cases 540a and 540b having the longest width of the ground member, an expanded frequency band (about 41 GHz) of the first cases 510a and 510b is the highest and an expanded frequency band (about 36 GHz) of the fourth cases 540a and 540b is the lowest. Thus, the expanded frequency band decreases as the width of the ground member increases.

Figure 16A:
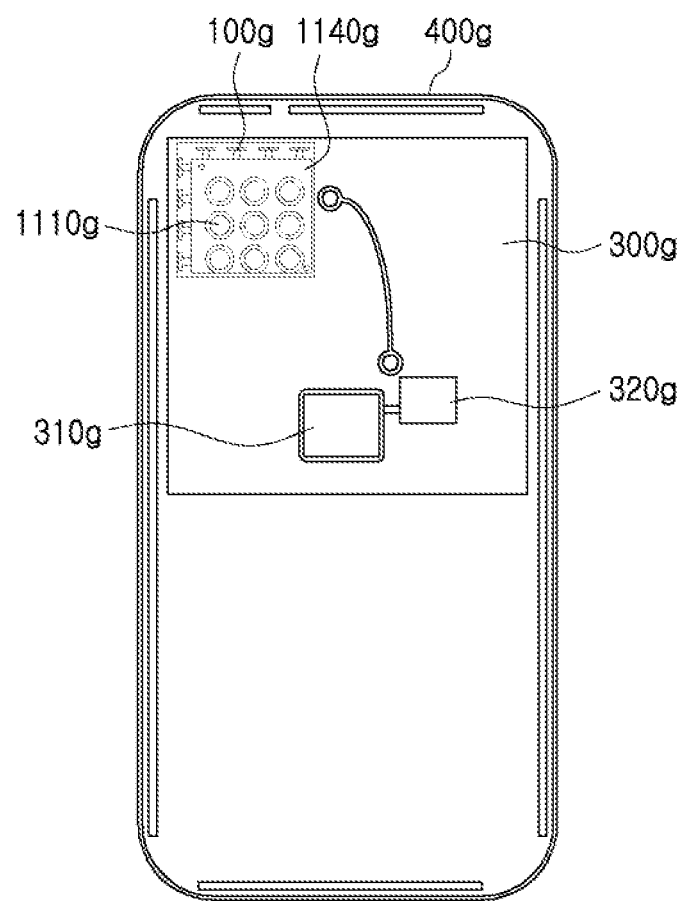
FIGS. 16A and 16B are views illustrating examples of layouts of an antenna module in an electronic device.
Figure 16B:
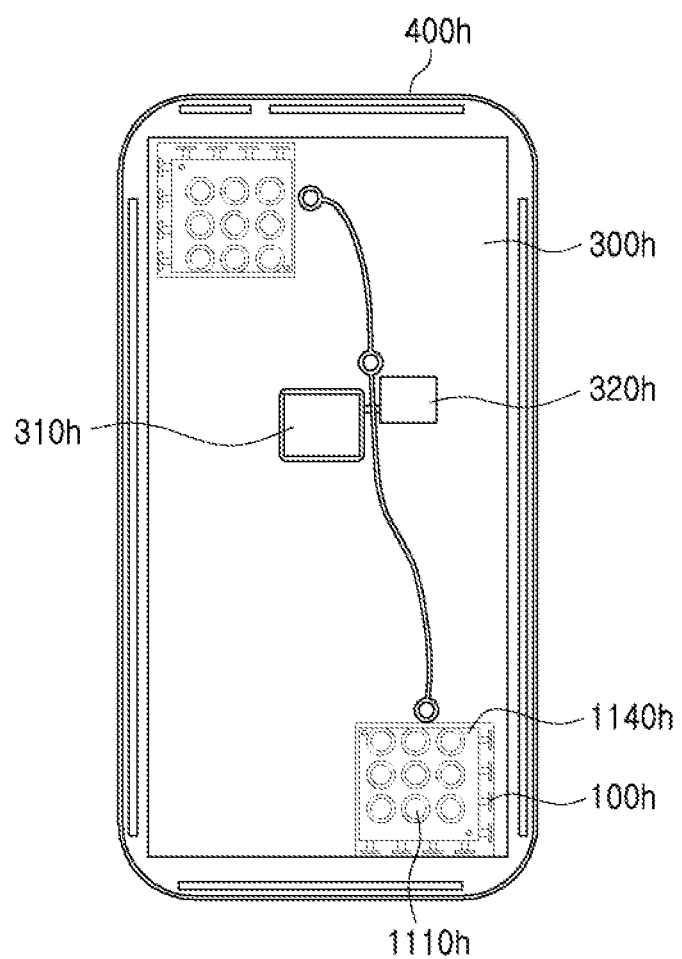

FIGS. 16A and 16B are views illustrating examples of layouts of an antenna module in an electronic device.

Referring to FIG. 16A, an antenna module including an antenna apparatus 100g, a director member 1110g, a dielectric layer 1140g, and an integrated circuit (IC) (not illustrated in FIG. 16A, but see FIGS. 12 and 13 for examples) is disposed adjacent to a side boundary of an electronic device 400g on a substrate 300g of the electronic device 400g.

The electronic device 400g may be a smartphone, a personal digital assistant, a digital video camera, a digital still camera, a network system, a computer, a monitor, a tablet, a laptop, a netbook, a television, a video game, a smartwatch, or an automotive component, but is not limited thereto.

A communications module 310g and a baseband circuit 320g are further disposed on the substrate 300g. The communications module 310g includes a memory chip such as a volatile memory (for example, a DRAM), a non-volatile memory (for example, a ROM), or a flash memory; an application processor chip such as a central processor (for example, a CPU), a graphics processor (for example, a GPU), a digital signal processor, a cryptographic processor, a microprocessor, or a microcontroller; and a logic chip such as an analog-digital converter or an application-specific IC (ASIC). However, these are just examples, and the communications module 310g is not limited thereto.

The baseband circuit 320g generates a baseband signal by performing analog-digital conversion, amplification, filtering, and frequency conversion of an analog signal. The baseband signal input and output from the baseband circuit 320g is transmitted to the antenna module through a cable.

For example, the baseband signal may be transmitted to the IC of the antenna module through the electrical connection structure 1340a, the core via 1360a, and the at least one wiring layer 1310a illustrated in FIG. 13. The IC converts the baseband signal into an RF signal of a millimeter wave (mmWave) band.

Referring to FIG. 16B, two antenna modules each including an antenna apparatus 100h, a director member 1110h, a dielectric layer 1140h and an integrated circuit (IC) (not illustrated in FIG. 16B, but see FIGS. 12 and 13 for examples) are disposed on a substrate 300h of an electronic device 400h so that one of the antenna modules is disposed adjacent to one side boundary of the electronic device 400h at one end of the electronic device 400h, and the other one of the antenna modules is disposed adjacent to an opposite side boundary of the electronic device 400h at the opposite end of the electronic device 400h. A communications module 310h and a baseband circuit 320h are further disposed on the substrate 300h.

The wiring layer, the feed line, the feed via, the antenna member, the ground member, the second to fifth ground members, the impedance conversion line, the ground layer, the shielding via, the pole via, the ground via, the director member, the antenna member, the feed via, the electrical connection structure, and the plating member disclosed herein may include a metal material (e.g., a conductive material such as copper (Cu), aluminum (Al), silver (Ag), tin (Sn), gold (Au), nickel (Ni), lead (Pb), titanium (Ti), or an alloy of any two or more thereof), and may be made by a plating method such as chemical vapor deposition (CVD), physical vapor deposition (PVD), sputtering, a subtractive process, an additive process, a semi-additive process (SAP), or a modified semi-additive process (MSAP), but is not limited thereto.

The RF signal disclosed herein may have a format according to Wi-Fi (Institute of Electrical and Electronics Engineers (IEEE) 802.11 family) Worldwide Interoperability for Microwave Access (WiMAX) (IEEE 802.16 Mobile Broadband Wireless Access (MBWA) (family), IEEE 802.20), Long-Term Evolution (LTE), Evolution-Data Optimized (EV-DO), Evolved High Speed Packet Access (HSPA+), High Speed Downlink Packet Access (HSDPA), High Speed Uplink Packet Access (HSUPA), Enhanced Data Rates for GSM Evolution (EDGE), Global System for Mobile Communications (GSM), Global Positioning System (GPS), General Packet Radio Service (GPRS), Code-Division Multiple Access (CDMA), Time-Division Multiple Access (TDMA), Digital Enhanced Cordless Telecommunications (DECT), Bluetooth, 3G, 4G, and 5G protocols, and any other wireless and wired protocols, but is not limited thereto.

In the examples described above, the antenna module omnidirectionally expands the transmission and reception direction of the RF signal by forming radiation patterns for transmission and reception of the RF signal in first and second directions that are different from each other, and improves the antenna performance (e.g., the transmission and reception rate, the gain, the bandwidth, and the directivity) in the second direction or enables dual-band transmission and reception in the second direction.

In addition, the antenna module is easily miniaturized while improving the transmission and reception performance of the RF signal in the first and second directions.

The dual-band antenna apparatus transmits and receives a dual-band RF signal while having a simplified structure.

While this disclosure includes specific examples, it will be apparent to after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An antenna module comprising:
a connection member comprising at least one wiring layer and at least one insulating layer;
an integrated circuit (IC) disposed on a first surface of the connection member and electrically connected to at least one wiring layer of the connection member; and
an antenna package disposed on a second surface of the connection member and comprising:
first antenna members configured to transmit or receive a radio frequency (RF) signal; and
first feed vias each having a first end electrically connected to a corresponding one of the first antenna members, and a second end electrically connected to a corresponding wire of at least one wiring layer of the connection member,
wherein the connection member further comprises:
a feed line having a first end electrically connected to a corresponding wire of at least one wiring layer of the connection member;
a second antenna member electrically connected to a second end of the feed line and configured to transmit or receive an RF signal; and
a ground member spaced apart from the feed line in a direction toward the first surface or the second surface of the connection member,
wherein the second antenna member is a dipole comprising a first pole and a second pole,
the feed line comprises a first feed line electrically connected to the first pole, and a second feed line electrically connected to the second pole, and
the ground member has a width greater than a distance between the first feed line and the second feed line and less than a total dipole length of the first pole and the second pole.

2. The antenna module of claim 1, wherein the second antenna member has an intrinsic frequency band determined by characteristics of the second antenna member, and an expanded frequency band determined by the width of the ground member.

3. The antenna module of claim 1, wherein the connection member further comprises a second ground member spaced apart from the feed line in a direction opposite to the direction in which the ground member is spaced apart from the feed line so that the feed line is disposed between the ground member and the second ground member.

4. The antenna module of claim 3, wherein the connection member further comprises:
a third ground member spaced apart from the second antenna member in a direction toward the first surface or the second surface of the connection member; and
a fourth ground member spaced apart from the second antenna member in a direction opposite to the direction in which the third ground member is spaced apart from the second antenna member so that the second antenna member is disposed between the third ground member and the fourth ground member,
one of the third ground member and the fourth ground member is disposed on a same level as the ground member, and
a remaining one of the third ground member and the fourth ground member is disposed on a same level as the second ground member.

5. The antenna module of claim 1, wherein the connection member further comprises a second feed via electrically connected between the feed line and the second antenna member, and the ground member is spaced apart from a side surface of the feed via.

6. The antenna module of claim 1, wherein the connection member further comprises:
a ground layer disposed on a same level as the feed line in the connection member and spaced apart from the feed line; and
shielding vias extending from the ground layer to block between at least one wiring layer of the connection member and the second antenna member.

7. The antenna module of claim 1, wherein the antenna package further comprises:
a dielectric layer surrounding a side surface of each of the plurality of first feed vias and having a height greater than a height of at least one insulating layer of the connection member; and
a plating member disposed in the dielectric layer surrounding the side surface of each of the plurality of first feed vias.

8. An antenna module comprising:
a connection member comprising at least one wiring layer and at least one insulating layer;
an integrated circuit (IC) disposed on a first surface of the connection member and electrically connected to at least one wiring layer of the connection member; and
an antenna package disposed on a second surface of the connection member and comprising:
first antenna members configured to transmit or receive a radio frequency (RF) signal, and
first feed vias each having a first end electrically connected to a corresponding one of the first antenna members, and a second end electrically connected to a corresponding wire of at least one wiring layer of the connection member,
wherein the connection member further comprises:
a feed line having a first end electrically connected to a corresponding wire of at least one wiring layer of the connection member;
a second antenna member electrically connected to a second end of the feed line and configured to transmit or receive an RF signal; and
a ground member spaced apart from the feed line in a direction toward the first surface or the second surface of the connection member;
a third ground member spaced apart from the second antenna member in a direction toward the first surface or the second surface of the connection member; and
a fourth ground member spaced apart from the second antenna member in a direction opposite to the direction in which the third ground member is spaced apart from the second antenna member so that the second antenna member is disposed between the third ground member and the fourth ground member.

9. The antenna module of claim 8, wherein the connection member further comprises a fifth ground member disposed closer to the connection member than the second antenna member and connecting the third ground member and the fourth ground member to each other, and
the fifth ground member is disposed to block between a portion of the second antenna member and the ground member and to open between a remaining portion of the second antenna member and the ground member.

10. The antenna module of claim 8, wherein the second antenna member is a dipole comprising a first pole and a second pole spaced apart from the first pole, the third ground member has a first gap extending between the first pole and the second pole, and the fourth ground member has a second gap extending between the first pole and the second pole.

11. The antenna module of claim 10, wherein the connection member further comprises a pole via connecting one of the first pole and the second pole to one of the third ground member and the fourth ground member.

12. The antenna module of claim 10, wherein the connection member further comprises a director member disposed between the third ground member and the fourth ground member, extending across the first gap and the second gap, and spaced apart from the second antenna member.

13. An antenna module comprising:
a connection member comprising at least one wiring layer and at least one insulating layer;
an integrated circuit (IC) disposed on a first surface of the connection member and electrically connected to at least one wiring layer of the connection member; and
an antenna package disposed on a second surface of the connection member and comprising:
first antenna members configured to transmit or receive a radio frequency (RF) signal, and
first feed vias each having a first end electrically connected to a corresponding one of the first antenna members, and a second end electrically connected to a corresponding wire of at least one wiring layer of the connection member,
wherein the connection member further comprises:
a feed line having a first end electrically connected to a corresponding wire of at least one wiring layer of the connection member;
a second antenna member electrically connected to a second end of the feed line and configured to transmit or receive an RF signal; and
a ground member spaced apart from the feed line in a direction toward the first surface or the second surface of the connection member;
an impedance conversion line electrically connected between the feed line and the second antenna member; and
the ground member is spaced apart from the impedance conversion line in the direction toward the first surface or the second surface of the connection member.

14. A dual-band antenna apparatus comprising:
a first feed line having a first end electrically connected to an integrated circuit (IC);
a second feed line having a first end electrically connected to the IC;
a first pole electrically connected to a second end of the first feed line and configured to transmit or receive a radio frequency (RF) signal;
a second pole electrically connected to a second end of the second feed line and configured to transmit or receive the RF signal;
a first ground member spaced apart from the first feed line and the second feed line in a first direction; and
a second ground member spaced apart from the first feed line and the second feed line in a second direction opposite to the first direction,
wherein each of the first ground member and the second ground member has a width greater than a distance between the first feed line and the second feed line, and less than a total dipole length of the first pole and the second pole, and the first pole and the second pole have an intrinsic frequency band of a dipole, and an expanded frequency band different from the intrinsic frequency band determined by the width of the first ground member and the width of the second ground member.

15. The dual-band antenna apparatus of claim 14, further comprising:
a first arm member covering a first side of the first pole;
a second arm member covering a second side of the first pole opposite to the first side of the first pole;
a third arm member covering a first side of the second pole;
a fourth arm member covering a second side of the second pole opposite to the first side of the second pole;
a first pole via connecting the first arm member and the first pole to each other; and
a second pole via connecting the third arm member and the second pole to each other.

16. An antenna module comprising:
a connection member comprising wiring layers;
a feed line connected to a wire in a wiring layer of the connection member;
a first antenna member connected to the feed line and configured to either one or both of transmit a first radio frequency (RF) signal and receive a second RF signal;
a first ground member connected to a wiring layer of the connection member, the first ground member being spaced apart from the feed line, and disposed between the wiring layer to which the first ground member is connected and the first antenna member; and
a second ground member spaced apart from the first antenna member and the first ground member.

17. The antenna module of claim 16, wherein the first ground member is an extension of the wiring layer to which the first ground member is connected, and extends in a first direction toward the antenna member; and the first antenna member is further configured to either one or both of transmit the first RF signal in the first direction and receive the second RF signal in a direction opposite to the first direction.

18. The antenna module of claim 17, further comprising an antenna package disposed on a surface of the connection member, the antenna package comprising:
a second antenna member configured to either one or both of transmit a third RF signal in a second direction different from the first direction and receive a fourth RF signal in a direction opposite to the second direction; and
a connecting member connecting the second antenna member to a wire in a wiring layer of the connection member,
wherein the third RF signal is the same as or different from the first RF signal, and
the fourth RF signal is the same as or different from the second RF signal.

* * * * *